United States Patent
Gambino et al.

(10) Patent No.: US 9,383,404 B2
(45) Date of Patent: Jul. 5, 2016

(54) HIGH RESISTIVITY SUBSTRATE FINAL RESISTANCE TEST STRUCTURE

(71) Applicant: INTERNATIONAL BUSINESS MACHINES CORPORATION, Armonk, NY (US)

(72) Inventors: Jeffrey P. Gambino, Westford, VT (US); Eric D. Johnson, Westford, VT (US); Ian A. McCallum-Cook, Burlington, VT (US); Richard A. Phelps, Colchester, VT (US); Anthony K. Stamper, Williston, VT (US); Michael J. Zierak, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/561,830

(22) Filed: Dec. 5, 2014

(65) Prior Publication Data
US 2016/0161545 A1 Jun. 9, 2016

(51) Int. Cl.
| H01L 23/58 | (2006.01) |
| H01L 31/04 | (2014.01) |
| G01R 31/26 | (2014.01) |
| H01L 29/06 | (2006.01) |
| H01L 29/10 | (2006.01) |

(52) U.S. Cl.
CPC ........ *G01R 31/2601* (2013.01); *H01L 29/0626* (2013.01); *H01L 29/0649* (2013.01); *H01L 29/1083* (2013.01)

(58) Field of Classification Search
None
See application file for complete search history.

(56) References Cited

U.S. PATENT DOCUMENTS

| 4,100,486 A | 7/1978 | Casowitz et al. |
| 4,595,944 A | 6/1986 | Antipov |
| 5,260,668 A | 11/1993 | Mallory et al. |
| 6,144,040 A | 11/2000 | Ashton |
| 6,403,389 B1 | 6/2002 | Chang et al. |
| 8,487,379 B2 | 7/2013 | Levy et al. |
| 2005/0142838 A1* | 6/2005 | Lee ........................ H01L 22/34 438/618 |
| 2010/0019295 A1* | 1/2010 | Henderson ............ H01L 31/107 257/292 |
| 2013/0244348 A1 | 9/2013 | Gambino et al. |

FOREIGN PATENT DOCUMENTS

CN 101834169 9/2010

OTHER PUBLICATIONS

Unknown, "Method and System for Measuring Substrate Resistivity Using Through Silicon Via (TSV) Test Structures", IPCOM000211607D, Oct. 13, 2011, 4 pages.

Orchard-Webb et al., "A Simple Test Structure for Measuring Substrate Resistivity," Microeectronic Test Structures, 1989, pp. 169-173.

* cited by examiner

*Primary Examiner* — Khaja Ahmad
(74) *Attorney, Agent, or Firm* — Anthony Canale; Andrew M. Calderon; Roberts Mlotkowski Safran Cole & Calderon, P.C.

(57) ABSTRACT

A high resistivity substrate final resistance test structure, methods of manufacture and testing processes are disclosed. The test structure includes spaced apart implants extending into a high resistivity wafer in at least one kerf region of the wafer. The test structure further includes contacts in direct electrical contact to each of the spaced apart implants.

20 Claims, 4 Drawing Sheets

US 9,383,404 B2

HIGH RESISTIVITY SUBSTRATE FINAL RESISTANCE TEST STRUCTURE

FIELD OF THE INVENTION

The invention relates to semiconductor structures and, more particularly, to a high resistivity substrate final resistance test structure, methods of manufacture and testing processes.

BACKGROUND

High resistance silicon substrates are used in analog and mixed signal technologies to reduce parasitic coupling and capacitance to substrate. Examples of devices that benefit from high resistance silicon include inductors (reduced eddy current losses in substrate), NPN transistors (reduced collector capacitance to substrate), and switch FET's (reduced parasitic capacitance to substrate, reduced high frequency rf harmonics losses to substrate).

The final resistivity of silicon is a function of several factors including, e.g.: (i) starting resistivity; (ii) oxygen content (e.g., oxygen turns into a n-type dopant with back end of the line (BEOL) process temperatures, e.g., low temperatures of about 400° C., and can type-convert a p-type substrate to n-type); and (iii) thermal history. In high resistance silicon substrate technologies the final substrate resistivity is specified within a predetermine range. Examples of final resistivity specifications include 1000+/−200Ω-cm p-type, 3000+/−1000Ω-cm p-type, 10,000+/−2000Ω-cm p-type, and 1000+/−300Ω-cm n-type. In general, as the substrate resistivity increases, the depletion region surrounding devices such as NPN collectors also increases and, if the substrate resistivity is out of specification on the high side or the p-type substrate type converts to n-type, then the depletion regions between two adjacent devices can merge or, in the case of type-conversion, the two devices can be shorted through the substrate. This merging or shorting results in high leakage currents and device failure. The formation of these depletion regions is also affected by operating temperature. In addition, if the resistivity flips from p-type to n-type, due to type conversion of oxygen to n-type dopants, all active and passive devices in the wafer effectively will be shorted together. Accordingly, in current process flows, active devices such as NPN transistors, CMOS transistors, and other active or passive devices are designed specified distances apart to avoid punch-through between collectors. The distance between these devices is calculated based on the final silicon resistivity specification and the maximum applied voltage, i.e., devices in a 10,000Ω-cm final resistivity substrate would be spaced further apart than devices in a 1000Ω-cm final resistivity substrate.

SUMMARY

In an aspect of the invention, a structure comprises two or more spaced apart implants with a first dopant polarity extending into a high resistivity wafer with the opposite dopant polarity in at least one region of the wafer; and contacts in direct electrical contact to each of the spaced apart implants.

In an aspect of the invention, a test structure comprises: N+ well implants formed in a high resistivity wafer, extending through an epitaxial layer and formed in plural regions of the high resistivity wafer; shallow trench isolation structures isolating the N+ well implants from one another; and contacts in direct electrical connection to each of the N+ well implants.

The spaced apart N+ well implants have a spacing therebetween such that punch though occurs prior to avalanche breakdown.

In an aspect of the invention, a testing procedure comprises applying voltage to test structure of N-type implants in a p-type wafer, within a kerf region, and measuring a punch-through current prior to an avalanche breakdown voltage, and using the punch-through current to measure the substrate resistivity.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
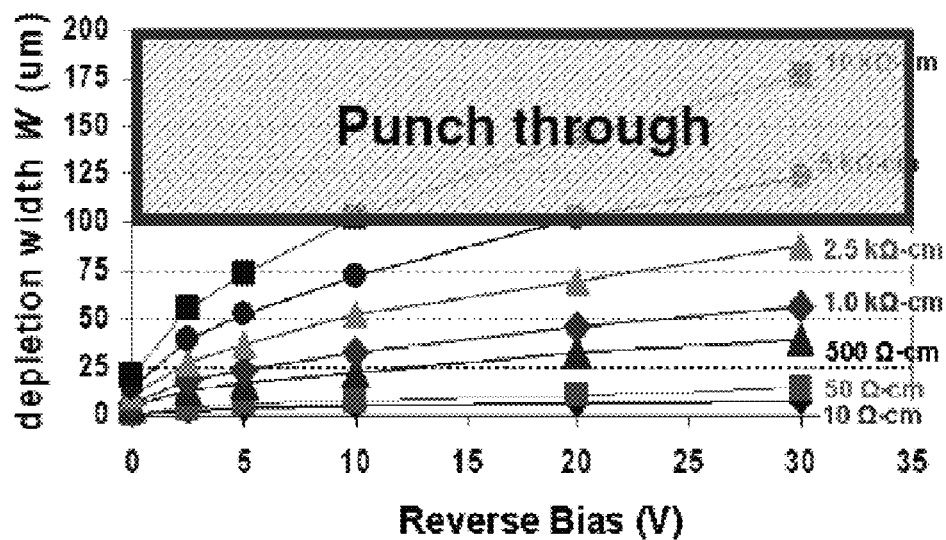
FIG. 1 shows a graph of junction depletion as a function of reverse bias.

The invention relates to semiconductor structures and, more particularly, to a high resistivity substrate final resistance test structure, methods of manufacture and testing processes. More specifically, the present invention provides silicon devices, such as N/P−/N designs, with varied width between n-wells. In this way, the test structures of the present invention exploit the relation of depletion region width to substrate doping.

Advantageously, the structures can be used as non-destructive structures to electrically measure substrate resistivity in high resistivity wafers post wafer processing or post packaging. In this way, as there is no means to practically measure each and every wafer by the end user or IC manufacturer of the chip, the present invention provides structures so that IC companies or end use clients can measure the final substrate resistivity in a non-destructive fashion, post wafer processing or packaging, to guarantee wafer reliability. The designs of the structures of the present invention were possible only after realizing the many challenges of high resistivity wafers.

High performance BiCMOS, CMOS, and SiGe devices use high resistivity n-type or p-type substrates, typically on the order of about 500 to 10,000Ω-cm. For the following discussion, the description will focus on high resistivity p-type substrates although this invention applies equally to high resistivity n-type substrates but with some or all of the dopant polarities (i.e. n-type or p-type) reversed. High resistivity p-type substrates have been found to significantly reduce: (i) SiGe HBT NPN collector-substrate capacitance and non- SiGe NPN collector-substrate capacitance, (ii) substrate noise (passive Q); (iii) device cross talk, (iv) NFET switch $2^{nd}$ and $3^{rd}$ harmonics and insertion losses, and (v) coplanar waveguide $2^{nd}$ and $3^{rd}$ harmonics losses. The high resistivity thus results in improved linearity, decreased signal loss and distortion, and improved CMOS integration. The high resistivity p-type substrates also allow for high performance power amplifiers and switches for RF applications. However, it has been found that many integration challenges exist with high resistivity p-type substrates, including increased depletion width, an increase in interstitial oxygen atoms which can type convert to n-type dopants, and difficulties controlling design specifications. In view of these many challenges, the present invention provides tests structures to measure resistivity to guarantee wafer reliability.

More specifically, high resistivity p-type substrates are extremely low doped (e.g., 1E13 boron atoms/cm$^3$), where it has been identified and verified by the inventor(s) that such low doping levels allows depletion regions to grow exceptionally large for moderate voltage biases. And, when depletion regions grow, they can merge leading to high leakage currents between devices. Leakage current risk also significantly increases with increasing resistivity. Thus, given the device layout or ground rules, substrates above the upper resistivity specification post processing have been found to be susceptible to leakage, but without any known non-destructive method to measure the final wafer resistivity and to ensure wafer reliability.

For example, the p-type resistivity specification could be 500 to 5000 ohm-cm, i.e., the upper p-type resistivity specification could be 5000 ohm-cm. Also, in extreme cases, in addition to depletion widths horizontally merging or punching through between two devices, depletion widths can reach all the way vertically through a bulk substrate to a ground plane on the thinned wafer bottom, resulting in punch-through which compromises performance.

FIG. 1 shows calculated depletion widths versus reverse bias voltage for various final p-type substrate resistivity. For two devices spaced 50 microns or for a device spaced 100 microns to a ground plane under the wafer, the depletion width continues to grow as reverse bias increases and the punch through region is labelled. Accordingly, it is important to know the final resistivity of the substrate, since high resistivity substrates can have larger depletion widths, thus shorting a device. Note that the specific final resistivity and specifications, device spacings, and wafer thickness over a ground plane are all variable and it is possible for punch through to occur for depletion widths of greater or less than 100 microns, depending on the specifications and layouts used.

On the other hand, as to interstitial oxygen challenges, oxygen thermally activates as n-type during BEOL anneals. It has been found that for lightly p-type substrates, oxygen content of greater than a few ppm begins to dominate over boron as it activates (during thermal anneal or other BEOL processes). At such levels, p-type wafers can dramatically increase in resistivity, either through the entire wafer or in the surface regions, which presents a leakage risk. Wafers may even type convert to n– type.

Table 1 shows starting wafer resistivity after the wafers were diced from the silicon boule and final wafer resistivity after wafers were processed with a BiCMOS process including multilevel wiring. The first two wafers, with starting resistivity of 1100 and 2300 ohm-cm, had low oxygen content and did not exhibit higher resistivity after wafer processing. The last two wafers, with starting resistivity of 900 and 3300 ohm-cm, had high oxygen content and either had much higher p-type resistivity or type converted to n-type resistivity post processing. Hence the need for a final wafer resistivity non-destructive test.

TABLE 1

| STARTING P-TYPE RESISTIVITY (Ω-CM) | FINAL P-TYPE RESISTIVITY (Ω-CM) |
|---|---|
| 1100 | 1100 |
| 2300 | 2300 |
| 900 | 8000 |
| 3300 | N-type |

Thus Table 1 shows starting resistivity, i.e. before any processing, and final resistivity, i.e. after wafer processing including anneals above 350° C., of two wafers that had low oxygen content (first 2 wafers) and two wafers that had high oxygen content (last 2 wafers).

Moreover, current wafer specifications are typically controlled by a supplier of the wafers. Czochralski wafers have oxygen levels of approximately 5 to 15 ppm. Float zone grown wafers have lower oxygen levels than Czochralski grown wafers but float zone grown wafers are not optimal for other parameters and, have other downsides and thus are not widely used in certain technologies.

The present invention solves the above challenges by employing an optimized device layout to exploit the relation of depletion region width to substrate doping. For example, the structures of the present invention provide N/P–/N designs, with varied width between –type regions. These structures can be manufactured in kerf regions (dicing channel of a chip) or inside active chips using a number of different tools implemented in CMOS technologies (e.g., integrated circuit (IC) technology). In general, the methodologies and tools are used to form structures with dimensions in the micrometer scale. For example, the structures of the present invention are built in high resistivity wafers using patterned masks and implantation processes to form n-type regions of different concentrations and distances from one another in P type wafers.

Figure 2:
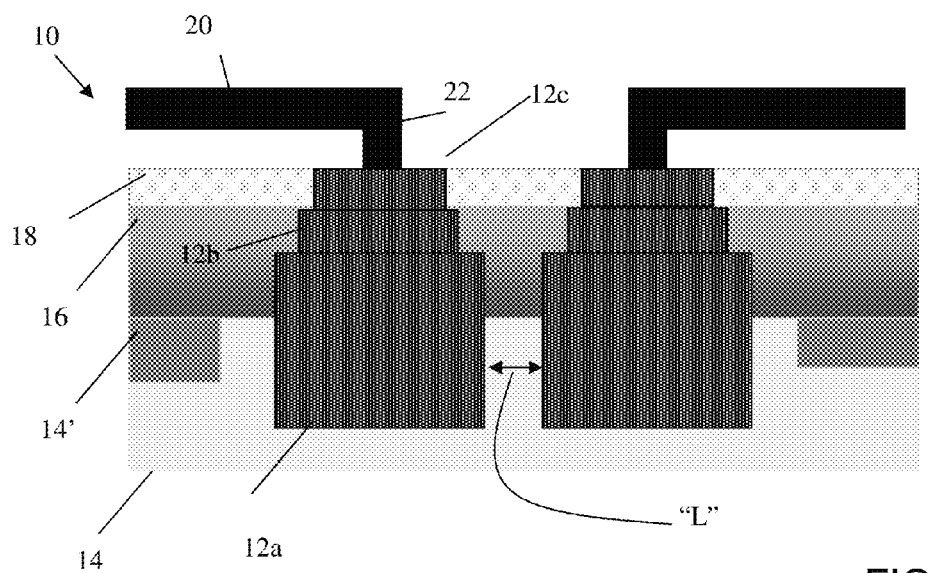
FIG. 2 shows a structure and representative fabrication processes according to aspects of the present invention.

Referring now to FIG. 2, in embodiments, a non-destructive structure 10 is provided to electrically measure substrate resistivity in high resistivity wafers post wafer processing or post packaging. In embodiments, the high resistivity wafer 14 can be a bulk high resistivity wafer or a handle wafer, including a buried oxide layer and silicon on insulator (SOI) substrate. In embodiments, the non-destructive structure 10 can be provided in kerf regions or dicing channels of the wafer, for testing the high resistivity wafers in different locations (as shown in FIGS. 4a and 4b), or inside the active chip.

In embodiments, the test structure includes N-type implants 12a, 12, and 12c formed in the high resistivity wafer 14. These N-type implants are used to form the BiCMOS and passive devices on the silicon wafer, such as NFET source/drain or NPN collector areas. In FIG. 2, three N-type implant regions are shown; although only one is required. The function of these N-type implants is to extend down into the high resistivity portion of the wafer, as will be discussed below. For the subsequent discussion, the one or more N-type implants, i.e., 12a, 12b, and 12c in FIG. 2, are referred to as layer 12.

The N-type implants 12 can extend through an optional epitaxial layer 16 and into the high resistivity wafer 14, optionally forming a NPN device sub-collector or an optional CMOS PFET triple well 12a. In embodiments, the N-type implants 12 are phosphorous, antimony, or arsenic implants which can include spacing "L" such that punch-through of the test structure 12 occurs prior to avalanche breakdown. Accordingly, by implementing the test structure 10, punch-through of the test structure 10 can be measured, which will occur with "out-of-specification" wafers prior to avalanche breakdown. Accordingly, it is possible to determine whether a wafer or chips on the wafer, meet design criteria and performance goals. It should be understood by those of skill in the art that avalanche breakdown occurs when carriers in a transition region are accelerated by an electric field to energies sufficient to free electron-hole pairs via collisions with bound electrons thus causing device shorting and high current; and punch through occurs when the depletion regions of two adjacent devices merge, resulting in high current.

The optimal spacing is a function of many parameters, including the minimum/nominal/maximum high resistivity substrate resistivity, the presence or absence of an epi layer, etc. For wafers with a resistivity target of 1000-3000 ohm-cm, it has been found that a spacing "L" of about 5 to 15 microns provides an optimal spacing to ensure:

1) Punch-through of the test structure 10 occurs prior to avalanche breakdown; and 2) Prior to avalanche breakdown, the pre- and post-punch through currents are in the range of 100 pA to 0.1 mA, which is easily measurable.

Figure 3:
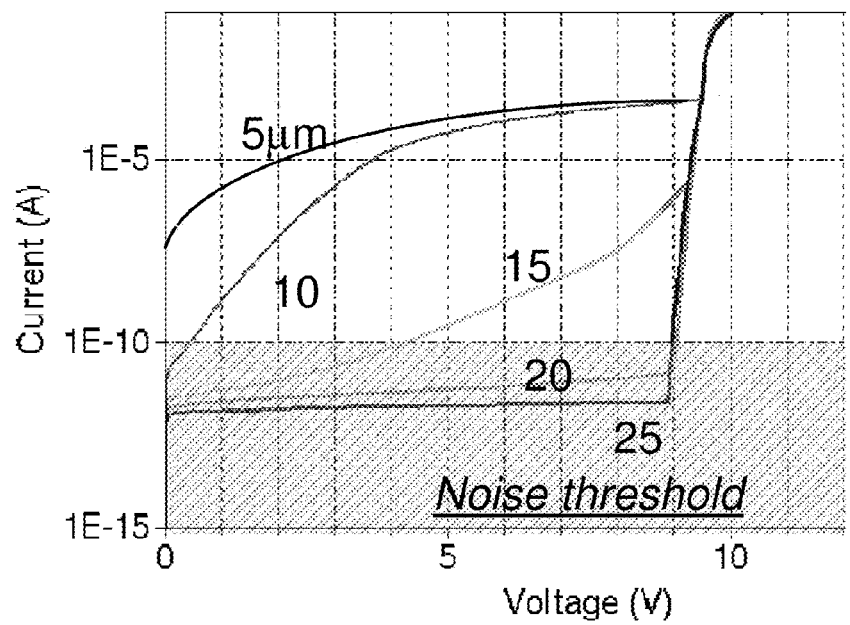
FIG. 3 shows a graph of current vs. voltage of the test structure shown in FIG. 2 according to aspects of the present invention with a p-type substrate resistivity of 2000 ohm-cm.

FIG. 3 shows current vs. voltage for the structure shown in FIG. 2, as a function of the spacing "L". For L=5 micron, punch through occurs at a low voltage and the sensitivity of this test structure to substrate resistivity differences is low. For L>=20 microns, avalanche breakdown occurs prior to punch through, thus providing no sensitivity to substrate resistivity differences. The optimal device for measuring differences in substrate resistivity for the structure shown in FIG. 2 and p-type substrate resistivity in the 1000 to 3000 ohm-cm range have L in the 10 to 15 micron range.

Figure 4:
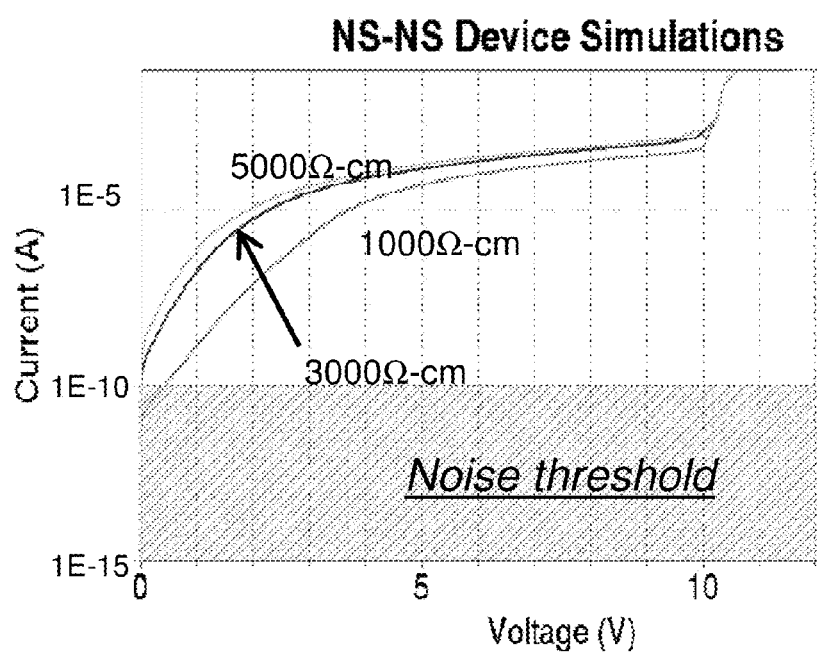
FIG. 4 shows a graph of current vs. voltage of a test structure according to aspects of the present invention for the structure shown in FIG. 2 with L=5 microns.
Figure 5:
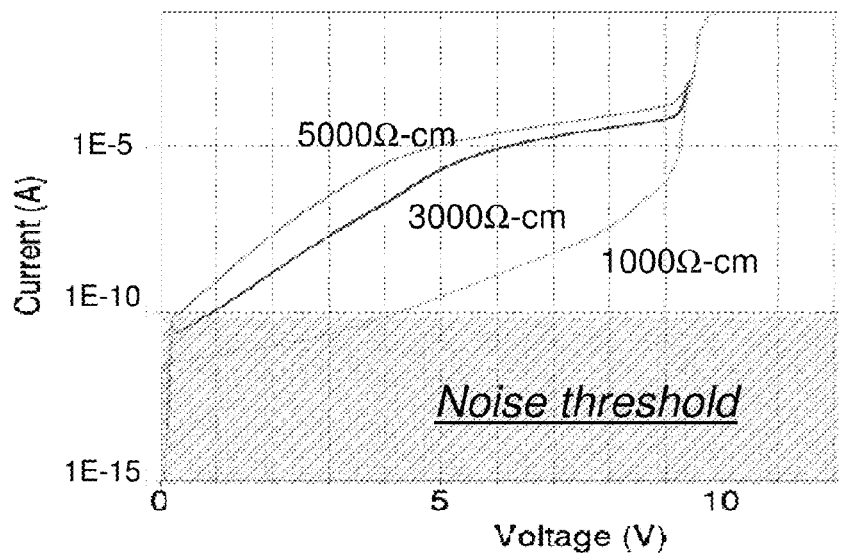
FIG. 5 shows a graph of current vs. voltage of a test structure according to aspects of the present invention for the structure shown in FIG. 2 with L=10 microns.
Figure 6:
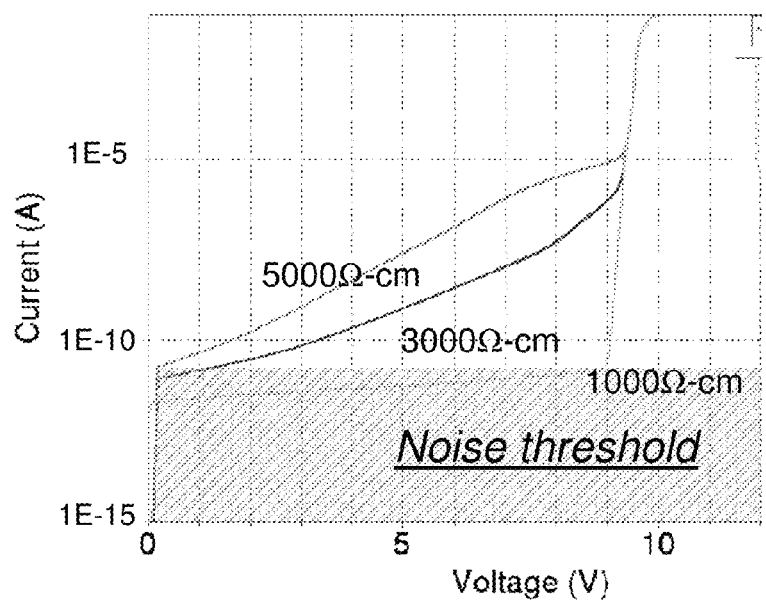
FIG. 6 shows a graph of current vs. voltage of a test structure according to aspects of the present invention for the structure shown in FIG. 2 with L=30 microns.

FIGS. 4-6 show current vs. voltage data for the structure shown in FIG. 2, as a function of final p-type substrate resistivity and spacing L, with L values of 5 microns (FIG. 4), 10 microns (FIG. 5), and 30 microns (FIG. 6). The 5 micron spacing used in FIG. 4 results in small differences in current, over the substrate resistivity range of interest at applied voltages below the avalanche breakdown voltage of approximately 9V. The 30 micron spacing used in FIG. 6 results in a significant portion of the leakage current falling below the measurement noise threshold. The 10 micron spacing used in FIG. 5 exhibits a good trade-off between inducing leakage currents above the noise threshold and having large differences in leakage currents as a function of substrate resistivity.

That is, by providing a spacing of about 10 microns between the N-type implants 12, punch-though of the structure 10 will occur prior to an avalanche effect while, for a 30 micron wide device, depletion will not occur in such a structure until about 10 V, which is greater than the avalanche voltage. Note that the device width affects the magnitude of the punch through current, i.e., doubling the device width from 15 to 30 microns would double the punch through current. The device width should be chosen to generate sufficient current to measure. Note that, as the device width increases, the area needed on the wafer increases and a balance between the punch through current and device area is needed. In additional embodiments, other spacings "L" can also be implemented with the structures depending on a width of a device, e.g., L=1 µm; L=100 µm; etc. Each of these lengths is critical for certain technologies in order to ensure punch-through occurs at a certain voltage, prior to an avalanche breakdown.

Referring still to FIG. 2, optional shallow trench isolation structures 18 separate (electrically isolate) adjacent N-type implants (e.g., layer 12). In embodiments, the shallow trench isolation structures 18 can be formed by deposition and planarization of an insulator layer in a trench. The shallow trench isolation structures 18 can be formed prior to or after the N-type implants 12, depending on the process flow. The structure 10 further includes optional p-wells 14', adjacent to the N-type implants 12. Optional well 14' is formed to form a low resistivity region for forming FET's, passives, NPNs, and other devices which cannot be formed directly in the high resistivity p-type substrate. The N-type implants 12 can be connected to wiring structures 20 by a respective interconnect 22. In this way, the test structure 10 can be electrically connected to probes, for testing. If the optional well 14' is formed, it is critical that it not be formed between the N-type implant regions 12, i.e., not in the area defined as "L" in FIG. 2.

Figure 7:
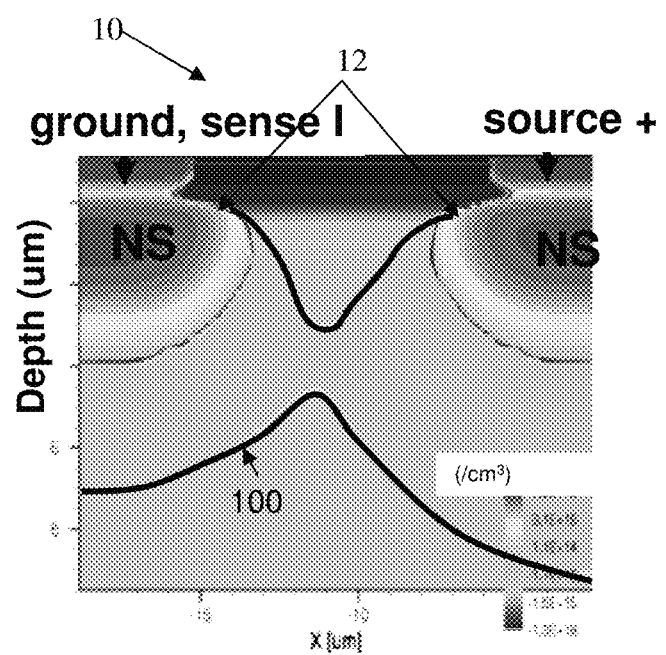
FIG. 7 shows a simulated model of a 2-dimensional image showing punch through of the test structures of the present invention.

FIG. 7 shows a TCAD model of a test structure in accordance with aspects of the present invention. More specifically, the TCAD model represents a test structure 10 with a spacing of 10 µm formed on a high resistivity p-type wafer with a voltage applied to the two electrodes to a to a high resistivity wafer. As shown in this representation, the depletion region 100 of the test structure has merged resulting in punch-through between the two N-type diffusions and high leakage current.

In embodiments, the process for measuring the final high resistivity substrate resistivity includes applying voltage to the test structure such that wafers in specification for resistivity do not punch-through and the voltage is under the avalanche breakdown voltage, e.g., 10V. This can be performed by applying probes to the wiring structures shown in FIG. 2.

In an aspect of the invention, the measured current for an applied voltage to test the structure of N-type implants in a p-type wafer is used to determine if the final wafer resistivity is within or outside the specification.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A test structure, comprising:
   two or more spaced apart implants with a first dopant polarity extending into a high resistivity wafer with an opposite dopant polarity of the first dopant polarity in at least one region of the high resistivity wafer, the spaced apart implants having a spacing therebetween such that punch though occurs prior to avalanche breakdown; and contacts in direct electrical contact to each of the spaced apart implants.

2. The test structure of claim 1, further comprising shallow trench isolation structures provided between the spaced apart implants.

3. The test structure of claim 1, wherein the spacing is about 10 μm and the device width is 30 um.

4. The test structure of claim 3, wherein a punch though voltage is less than an avalanche voltage.

5. The test structure of claim 3, wherein the spaced apart implants extend through an epitaxial layer.

6. The test structure of claim 3, further comprising P-wells positioned adjacent to the spaced apart implants.

7. The test structure of claim 3, wherein the spaced apart implants are n-type implants extending into the high resistivity wafer which is a p-type wafer.

8. The test structure of claim 7, wherein the n-type implants include a subcollector or triple well region.

9. The test structure of claim 7, wherein the punch though begins to occur at approximately 0.4 V bias for the high resistivity wafer with resistivity of 1 kΩ.

10. The test structure of claim 7, wherein the punch current for a 30 micron wide device ranges from 1E-15 to 1E-4 amps for the high resistivity wafer with resistivity in the range of 1KΩ to 5 kΩ at currents between 1E-15 to 1E-4 amps.

11. The test structure of claim 10, wherein the spaced apart implants are provided in multiple kerf regions of the high resistivity wafer.

12. A test structure comprising:
N+ well implants formed in a high resistivity wafer, extending through an epitaxial layer and formed in plural regions of the high resistivity wafer;
shallow trench isolation structures isolating the N+ well implants from one another; and
contacts in direct electrical connection to each of the N+ well implants,
wherein the spaced apart N+ well implants have a spacing therebetween such that punch though occurs prior to avalanche breakdown.

13. The test structure of claim 12, wherein the spacing is about 10 μm for a 30 micron wide device.

14. The test structure of claim 13, wherein the punch though occurs below application of 10 V.

15. The test structure of claim 13, wherein the spaced apart N+ well implants extend through the epitaxial layer and are positioned adjacent to P-wells.

16. The test structure of claim 15, wherein the N+ well implants include a subcollector region within the high resistivity wafer.

17. The test structure of claim 1, wherein punch current for a 30 micron wide device ranges from 1E-15 to 1E-4 amps for the high resistivity wafer with resistivity in the range of 1KΩ to 5 kΩ at currents between 1E-15 to 1E-4 amps.

18. The test structure of claim 17, wherein the high resistivity wafer is one of a handle wafer, a bulk wafer, and silicon-on-insulator (SOI) wafer.

19. A testing procedure comprising:
using a test structure, wherein the test structure is electrically connected to a probe and the test structure is within a kerf region of a wafer;
choosing a spacing between two N-type implants such that a punch through voltage is below an avalanche breakdown voltage between the two N-type implants;
applying a test voltage with the probe to the test structure of N-type implants in a p-type wafer; and
measuring a punch-through current generated by the test voltage, and using the punch-through current to measure a substrate resistivity.

20. The test structure of claim 4, wherein the punch though voltage is chosen for a trade-off between inducing a leakage current above a noise threshold and having large differences in leakage currents as a function of the high resistivity wafer resistivity.

* * * * *